United States Patent [19]

Neu

[11] Patent Number: 5,289,420
[45] Date of Patent: Feb. 22, 1994

[54] METHOD AND CIRCUIT FOR TRANSFERRING DIFFERENTIAL BINARY SIGNALS

[75] Inventor: Georges Neu, Mareil sur Mauldre, France

[73] Assignee: Bull S.A., Paris, France

[21] Appl. No.: 799,048

[22] Filed: Nov. 26, 1991

[30] Foreign Application Priority Data

Nov. 30, 1990 [FR] France .................. 90 15057

[51] Int. Cl.⁵ .................. G11C 7/00
[52] U.S. Cl. .................. 365/203; 365/207
[58] Field of Search .................. 307/530; 330/253; 365/201, 203, 207

[56] References Cited

U.S. PATENT DOCUMENTS

| | | | |
|---|---|---|---|
| 4,542,483 | 9/1985 | Procyk | 365/203 X |
| 4,634,890 | 1/1987 | Lee | 307/200 B |
| 4,932,002 | 6/1990 | Houston | 365/241 |
| 5,184,326 | 2/1993 | Hoffmann et al. | 365/203 X |

FOREIGN PATENT DOCUMENTS 0264933 4/1988 European Pat. Off. .
2317497 6/1974 Fed. Rep. of Germany .
1463621 2/1977 United Kingdom .

OTHER PUBLICATIONS

International Journal of Electronics, vol. 64, No. 3, Mar. 1988 pp. 409–415, London, G.B. Chu Phoon Chong, et al. "A High Resolution CMOS Comparator".

Kai Hwang: "Computer Arithmetric-Principle, Architecture and Design", 1979, pp. 80–84, Wiley and Sons.

*Primary Examiner*—Steven Mottola
*Attorney, Agent, or Firm*—Weingarten, Schurgin, Gagnebin & Hayes

[57] ABSTRACT

A method for transferring an element of binary information of the differential type present on two first bit lines to two second bit lines through a differential amplifier. The method includes a precharging phase followed by an evaluation phase of the first bit lines. The precharging phase consists of short-circuiting the first bit lines to each other and short-circuiting at least one of the second bit lines to the first bit lines. Such a differential amplifier may be utilized in an electronic circuit and assembly such as a carry select adder circuit.

15 Claims, 4 Drawing Sheets

METHOD AND CIRCUIT FOR TRANSFERRING DIFFERENTIAL BINARY SIGNALS

FIELD OF THE INVENTION

The invention relates to the general problem of transferring electrical signals of the differential type.

BACKGROUND OF THE INVENTION

Problems arise in the making of electrical assemblies including circuits that create logic signals whose value is defined by the sign of the potential difference between two output lines of these circuits.

These signals are generally applied to the inputs of other circuits in the assembly, and these circuits can themselves furnish differential signals intended for other circuits located downstream.

These output signals are created by an output stage able to furnish sufficient power to supply the input stages of the downstream circuits. In the case of differential binary signals, differential amplifiers are often used as the output stage.

For performance reasons, particularly in MOS or CMOS technology, "precharging" circuits are commonly used. During a first "precharging" phase the differential lines are charged with a given voltage then, during a second "evaluation" phase the lines are charged to voltages defining a logic state which is a function of the input signals applied to the circuit. Thus, in the case of differential signals, when one of the lines is evaluated at a first voltage, the supply voltage for example, the other line is charged to a second voltage, the ground voltage for example. In this case, the attempt is made to precharge the lines to a voltage close to half the supply voltage in order to reduce the line switching time. Precharging is then generally accomplished by means of a precharging circuit which, under the control of a precharging signal, places the lines in communication with an auxiliary supply supplying a voltage which is half the supply voltage. Usually, the precharging circuit has an equalizing circuit to short-circuit the two lines to ensure that the precharging voltages of these lines are equal.

However, this classic solution has the drawback of requiring an auxiliary power supply whose voltage is difficult to adjust precisely, particularly in the case of integrated circuits. This is because integrated circuits have wide manufacturing differences and it is not easy to modify the characteristics of some of their subassemblies after manufacture.

SUMMARY OF THE INVENTION

Thus, the goal of the invention is to solve this problem and its subject is a method for transferring an element of binary information of the differential type present in two bit lines to two second bit lines through a differential amplifier, said method involving a precharging phase followed by an evaluation phase of said first bit lines, said method being characterized by said precharging phase consisting of short-circuiting said first bit lines to each other and short-circuiting at least one of said second bit lines to said first bit lines.

In addition to the economy of an auxiliary power supply, this solution has the advantageous feature that the voltage applied during precharging to the input lines of the differential amplifier adjusts automatically to a level which places the amplifier in its maximum instability state, regardless of manufacturing differences. As a result, the switching time of the amplifier at the next evaluation is minimal.

In general, the differential signals thus amplified are applied to the inputs of other circuits also requiring precharging. Thus, it is appropriate also properly to precharge the output lines of the amplifier and, according to an additional characteristic of the invention, the method is also characterized by the second bit lines being short-circuited to each other during the precharging phase.

The method just described may sometimes present a difficulty linked to consumption by the amplifier during precharging. This is because, during this phase, the amplifier is short-circuited and feeds its own internal impedances. Thus, in the case where the amplifier has low internal impedances, for example in an assembly requiring a relatively powerful amplifier, consumption may become high and cause a substantial temperature rise. This results in particular in deteriorated performance caused by the increased switching time of components such as the MOS transistors in the integrated circuit. The same problem may arise if a large number of circuits of this type are used in one and the same integrated circuit.

To overcome this disadvantage in the aforementioned cases, and according to another aspect of the invention, the method is also characterized by consisting of using a first differential amplifier having high internal impedances and a second differential amplifier with three states that has low internal impedances, by the inputs and the outputs respectively of said first and second differential amplifiers being connected in parallel and by said second differential amplifier being placed in the high impedance state during said precharging phase.

The invention also relates to an electronic circuit to work the method. The electronic circuit according to the invention has at least one binary output of the differential type composed of two bit lines connected to the input of a differential amplifier. The bit lines are precharged to a given voltage during a precharging phase followed by an evaluation phase and this circuit is characterized by comprising first means to short-circuit said two bit lines and second means to short-circuit at least one of the output lines of the differential amplifier to at least one of the bit lines, said first and second means being activated during said precharging phase.

According to another aspect of the circuit according to the invention, it is characterized by comprising third means to short-circuit the two output lines of the differential amplifier to each other.

According to another aspect, the circuit is characterized by the differential amplifier being composed of a first differential amplifier with high internal impedances and of a second differential amplifier with three states (tri-state) that has low internal impedances, the inputs and the outputs of said first and second differential amplifiers respectively being connected in parallel and by said second differential amplifier being placed in the high impedance state during said precharging phase.

Other characteristics and design details in CMOS technology of the circuit according to the invention will emerge in the remainder of the specification.

The method and circuit which have just been presented have a particularly useful application in assemblies using a plurality of circuits mounted in cascade, each circuit furnishing binary information of the differential type to circuits located downstream. In fact, the speed of operation of this type of assembly is strongly dependent on the speed of transmission of the output signals from a circuit to circuits downstream. Hence it is important for the output stages to switch rapidly. In the case of a synchronous assembly, this allows the clock frequency to be increased.

Thus, the invention also has as its subject an assembly comprising a plurality of electronic circuits connected in cascade, each circuit providing at the output to at least one circuit located downstream, at least one element of binary information of the differential type, characterized by each of said circuits conforming to the circuit according to the invention defined above.

In this type of assembly, it is important for the circuit precharging and evaluation phases to occur in the proper order in order for evaluation of a circuit not to be triggered before the circuit or circuits upstream have themselves been evaluated.

With this goal in mind, the assembly according to the invention is also characterized by comprising a plurality of inverters connected in cascade and associated respectively with the electronic circuits and with the differential amplifiers constituting said assembly, by the first of said inverters receiving at the input a clock signal and by said precharging and evaluation phases of a differential amplifier being controlled by the input and/or output signals of the inverter associated with said differential amplifier.

There are numerous examples of assemblies to which the invention may apply. They may in particular be circuits with a modular design. This arrangement is normally desired with a view to an integrated circuit design since the regularity of the modular circuits allows the integration density to be increased. Thus, in modular circuits, there is often the problem of the time taken for the signals leaving one module to propagate to the module or modules located downstream, and this problem may advantageously be solved according to the invention.

This is particularly the case for adders of the "carry select adder" type which can be used in computer system processors where it is important for the adders to be fast, because the performance of the entire system depends on them.

The invention also has as its subject an adder circuit with two numbers of n×p bits of the carry select type, composed of p addition modules, each module comprising:

two adders with n bits whose carry inputs are prepositioned at 1 and 0 respectively,
and a multiplexer to select the output of one of the two adders, each adder having a carry output of the differential type, each module being associated with a carry select circuit furnishing the multiplexer select signal of the downstream module as a function of the carry bits coming from the two adders and of the select signal furnished by the upstream select circuit, characterized by each adder with n bits conforming to the electronic circuit according to the invention, the binary output of the differential type being the carry output of said adders.

DESCRIPTION OF THE DRAWINGS

Other characteristics and implementation details of the invention will be described in the remainder of the specification in relation to the figures wherein.

DETAILED DESCRIPTION OF THE INVENTION

Figure 1:
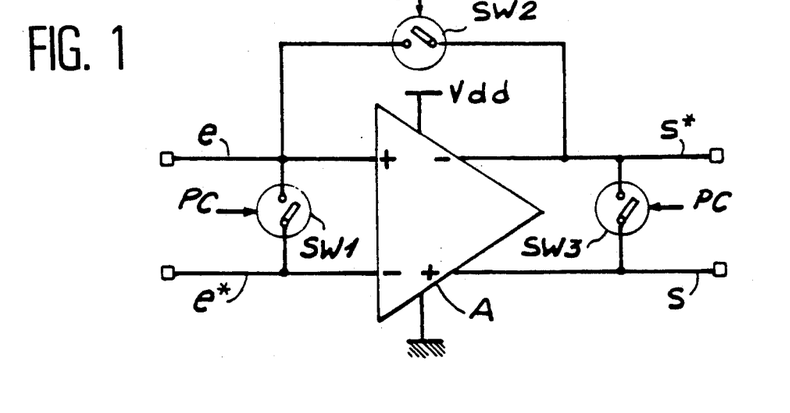
FIG. 1 represents the essential part of the electronic circuit allowing the invention to be implemented.

FIG. 1 represents in a general way the essential means for working the invention. They comprise a differential amplifier A whose direct and inverting inputs, e and e* respectively, are connected to corresponding output lines in a circuit not shown. The direct and inverting outputs, s and s* respectively, are connected to the corresponding input lines of other circuits not shown. Amplifier A has two supply terminals connected respectively to ground and a supply voltage source Vdd.

A first switch SW1 controlled by a precharging signal PC is connected between the two input lines of amplifier A. A second switch SW2 also controlled by the precharging signal PC connects one of the outputs, s* for example, to one of the inputs, e for example. Additionally, a third switch SW3 controlled by precharging signal PC connects outputs s and s* with each other.

Figure 2:
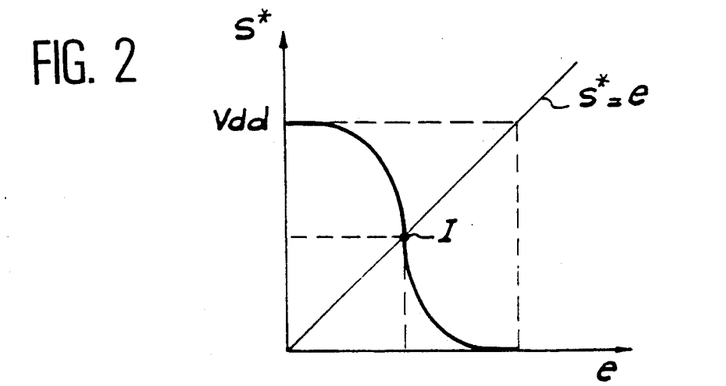
FIG. 2 is a diagram explaining the properties of the circuit in FIG. 1.

The operation of the circuit of FIG. 1 will now be described with the aid of the graph shown in FIG. 2. This graph represents the variations in the voltage present at inverting output s* as a function of the voltage applied to direct input e. In the remainder of the specification, we will use the convention of positive logic according to which a signal takes on logic value 1 when the corresponding voltage relative to ground is equal to supply voltage Vdd, for example 5 V, and assumes logic value 0 when its voltage is zero.

The circuit according to the invention operates in two phases: a precharging phase activated by the precharging control signal PC followed by an evaluation phase during which signal PC is inactive. In the latter case, switches SW1, SW2, SW3 are open and amplifier A operates normally, namely places its outputs s and s* at 5 V and 0 V or at 0 V and at 5 V, respectively, depending on the sign of the potential difference between its inputs e and e*.

During precharging, under the control of signal PC, the three switches SW1, SW2, SW3 are closed. Amplifier A then feeds its internal impedances by assuming an equilibrium state I represented in FIG. 2 such that $e = e^* = s^* = s$.

As the diagram shows, working point I corresponds essentially to a state in which the amplifier has a maximum dynamic gain. Thus, at the next evaluation, outputs s and s* will be placed at their evaluation voltage at maximum speed. Moreover, this property is maintained regardless of the size of the amplifier and hence independently of manufacturing differences in the case of integrated circuits.

Figure 3:
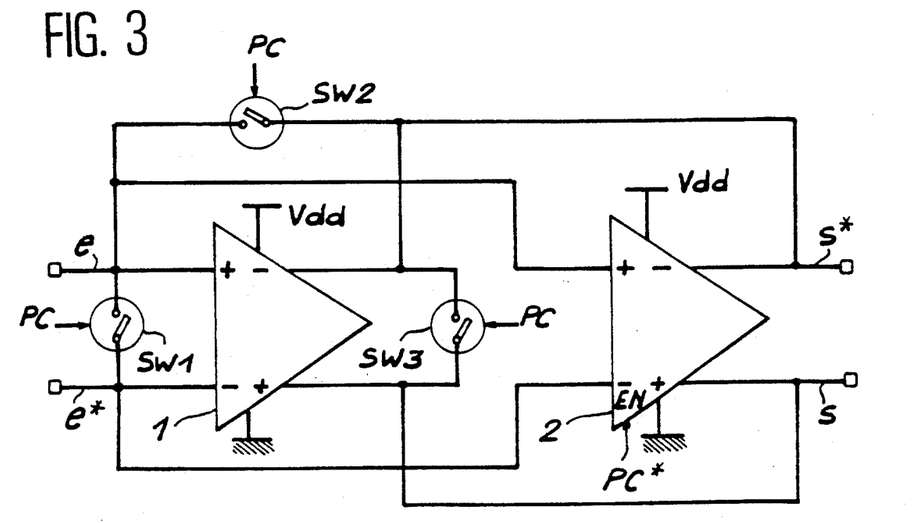
FIG. 3 represents an alternative embodiment of the invention.

FIG. 3 represents an alternative embodiment of the circuit of FIG. 1. This variant is provided for the case in which it is necessary to reduce the consumption of the amplifier during the precharging phase. For this purpose, amplifier A is replaced by two amplifiers 1, 2 in parallel. First amplifier 1 is dimensioned so that it has relatively high internal impedances. Amplifier 2 is a three-state amplifier with lower internal impedances. Amplifier 2 has a validation input EN allowing it to be placed in the high-impedance state.

As above, switch SW1 connects inputs e, e* with each other, switch SW2 connects one output s* to one input e, and switch SW3 connects outputs s, s* with each other, these three switches being controlled by precharging signal PC.

The circuit of FIG. 3 operates as follows. During the precharging phase, signal PC is active and switches SW1, SW2, SW3 are closed. Moreover, signal PC*, the complement of PC, applied to validation input EN of amplifier 2, places the latter in the high-impedance state. As a result, amplifier 2 is not the source of any consumption. As in the previous embodiment, amplifier 1 precharges the input and output lines to an equilibrium voltage which is close to half the supply voltage Vdd.

During the following evaluation phase, PC=0 and PC*=1. The three switches are then open and amplifier 2 is active. As above, at the beginning of each evaluation phase, the two amplifiers are placed in a state in which they have practically a maximum dynamic gain.

It should be noted that the sizes of the two amplifiers will depend on the technology and application context of the invention. In particular, the values of the internal impedances of amplifier 1 must be chosen to be sufficiently high to limit the temperature to a level suitable for proper operation of the circuit and low enough for the lines to be completely precharged by the end of the precharging phase at the latest. This choice in each particular case is within the scope of the individual skilled in the art and thus requires no additional comment.

Figure 4:
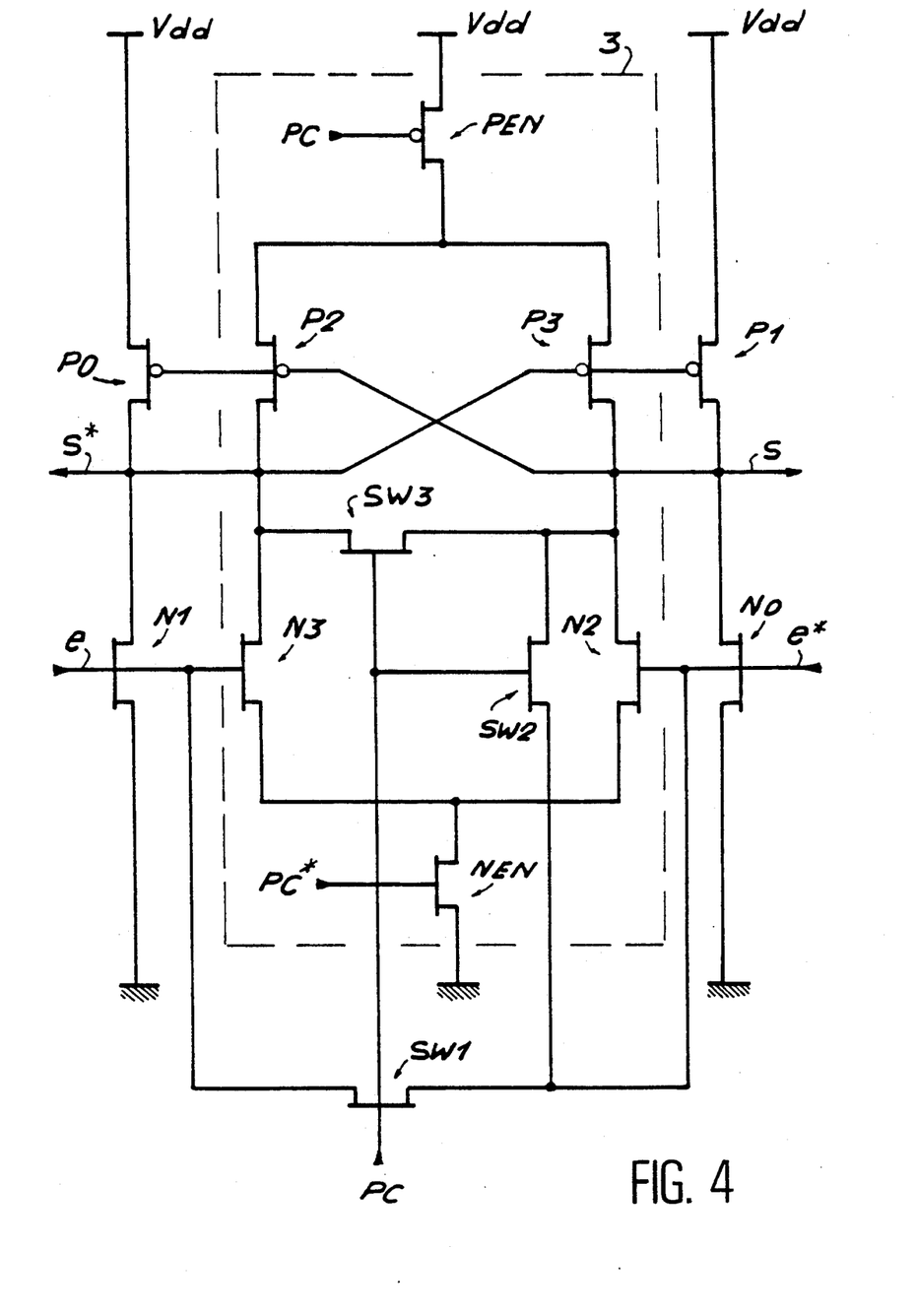
FIG. 4 represents an embodiment of the circuit in FIG. 3, in CMOS technology.

FIG. 4 represents an embodiment in CMOS technology of the circuit of FIG. 3. Amplifier 1 is composed of PMOS transistors P0, P1 and NMOS transistors N0, N1. Transistors P0 and N1 and P1 and N0 are connected in series between ground and supply voltage Vdd. The grids of transistors N1 and N0 constitute inputs e and e* respectively. The drains of transistors N0 and P1 constitute output s, while the drains of transistors P0 and N1 constitute output s*. Outputs s and s* are connected to the grids of transistors P0 and P1, respectively.

Subassembly 3 of FIG. 4 includes amplifier 2 as well as switches SW2 and SW3. Amplifier 2 is composed of PMOS transistors P2, P3 and NMOS transistors N2, N3. As in the case of amplifier 1, transistors P2 and N3 and P3 and N2 are connected in series. The grids of transistors N3 and N2 are connected to inputs e and e*, respectively. The drains of transistors P3 and N2 are connected to output s and the drains of transistors P2 and N3 are connected to output s*. Outputs s and s* are connected to the grids of transistors P2 and P3, respectively. The sources of transistors P2 and P3 are connected to supply voltage Vdd through a PMOS transistor PEN whose grid receives precharging signal PC. The sources of transistors N2 and N3 are connected to ground through an NMOS transistor NEN whose grid receives signal PC*.

Inputs e and e* are connected together through the drain-source path of an NMOS transistor SW1. Output s is connected to input e* through the drain-source path of an NMOS transistor SW2. Outputs s and s* are connected together through the drain-source path of NMOS transistor SW3. The three transistors SW1, SW2, and SW3 receive precharging signal PC at their grids.

The operation of the circuit in FIG. 4 can easily be seen from the diagram. During the precharging phase, signal PC has a positive voltage and transistors SW1, SW2, SW3 are conducting while transistors NEN and PEN are blocked. Thus, amplifier 2 is disconnected from its power supply. In contrast, transistors P0 and N1 on the one hand and P1 and N0 on the other hand constitute voltage dividers due to the resistant state of their drain-source path which is partially conducting.

At the end of precharging, signal PC goes to zero again and signal PC* reverts to a positive voltage. Hence, transistors SW1, SW2, SW3 open and transistors NEN and PEN close. The two amplifiers 1, 2 then operate normally as differential amplifiers.

It should be noted that the internal impedances and power gain of the amplifiers are conditioned by the resistance of the drain-source paths of the transistors of which they are composed. These resistances can be adjusted by appropriate dimensioning of the transistors, particularly by the choice of their width.

As an alternative embodiment, the NMOS transistors of which switches SW1, SW2, SW3 are composed can be replaced by CMOS transfer gates. In this case, a PMOS transistor whose grid receives signal PC* can be connected in parallel with each NMOS transistor. This modification improves the effect of short-circuiting the switches.

Figure 5:
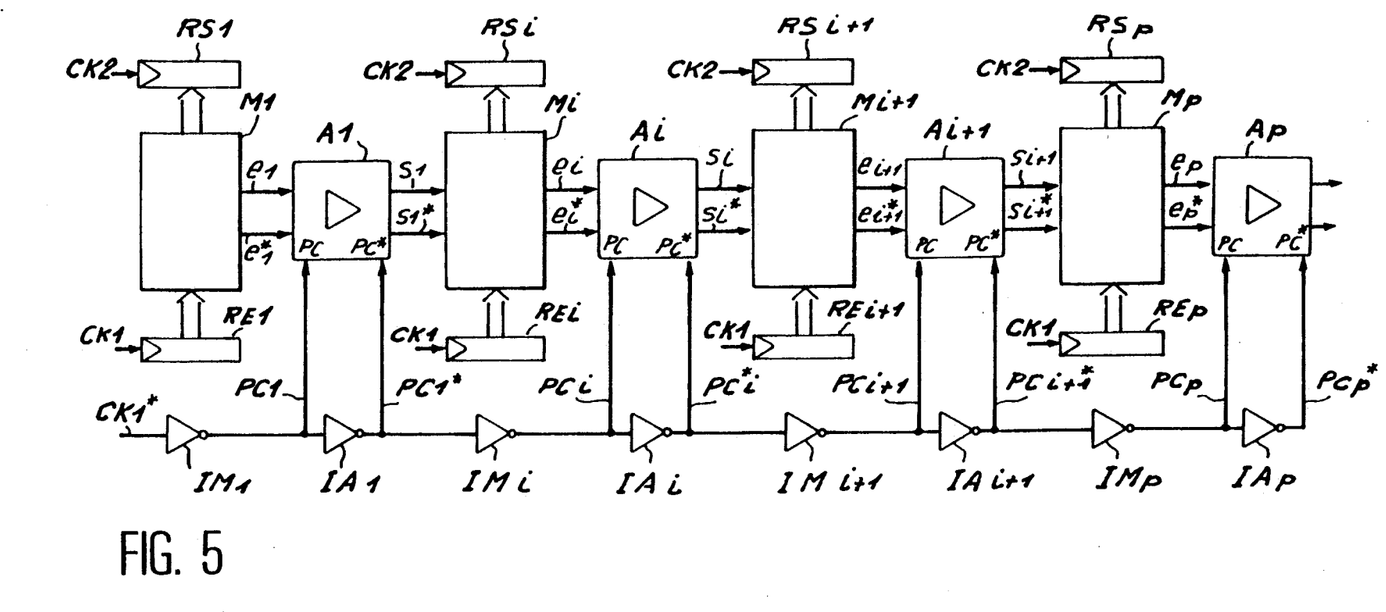
FIG. 5 represents an assembly using the method and electronic circuit according to the invention.

FIG. 5 shows an assembly in which the invention is applied. This assembly comprises a plurality of circuits M1, Mi, Mi+1, Mp. Each circuit, Mi for example, receives at least one differential signal s1, s1* coming from at least one circuit located upstream and provides at least one differential output ei, ei* intended for at least one circuit Mi+1 located downstream.

Transmission of each differential signal ei, ei* coming from a circuit Mi to downstream circuit Mi+1 is effected by means of a differential amplifier Ai according to the invention. Thus, differential output ei, ei* from one of circuits Mi serves as an input for amplifier Ai which at its output furnishes differential signal si, si* applied to the input of one of the downstream circuits Mi+1.

Each circuit generally has other inputs and other outputs allowing them to take the input variables into account and supply results. It is assumed, for simplicity, that these data were respectively in input registers RE1, REi, REi+1, REp and output registers RS1, RSi, RSi+1, RSp.

Figure 6:
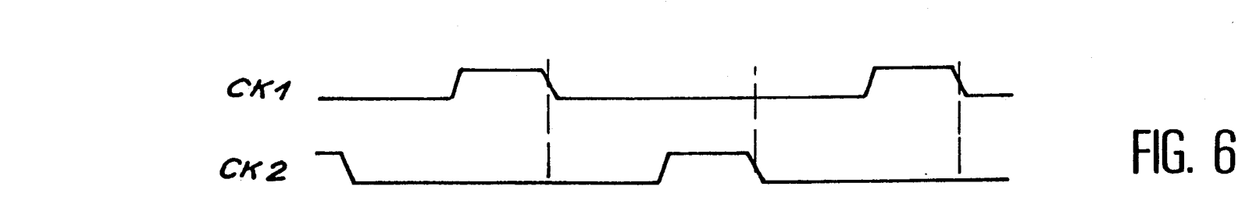
FIG. 6 is a graph showing the clock signals used in the assembly of FIG. 5.

The assembly is synchronized by clock signals CK1 and CK2 shown in FIG. 6. In the top position, signals CK1 and CK2 are active and lock input register REi and output register RSi, respectively. Hence, precharging of lines ei, ei* can start with the rising front of signal CK1 but the following evaluation must be completed before the falling front of the following signal CK2.

According to one advantageous assembly feature, a set of inverters IM1, IA1, IMi, IAi, IMi+1, IAi+1, IMp, IAp wired in cascade is provided, the first of which, IM1, receives the complement CK1* of clock signal CK1. Each inverter IMi or IAi is associated respectively with a circuit Mi or an amplifier Ai. Input PCi and/or output PCi* of an inverter IAi associated with an amplifier Ai furnish signals used to control precharging of amplifier Ai associated with inverter IAi.

The assembly in FIG. 5 operates as follows. When clock signal CK1 becomes active, precharging signals PCi, PCi* propagate downstream via inverters IMi, IAi. Amplifiers Ai then, in turn, precharge the differential lines. At the same time, the input signals are charged in input registers REi.

When CK1 reverts to zero, signals PCi and PCi* change state with a delay that is a function of the number of inverters that input signal CK1* must traverse. As a result, differential signals ei, ei* are evaluated in the downstream direction in synchronism with the change in state of precharging signals PCi and PCi*. Through an appropriate choice of the technology used and/or the frequency of the clock signals, the evaluation will be completed in each circuit before the falling front of the next signal CK2 which also defines the end of locking of the results into registers RSi.

Of course, each inverter IMi, IAi is dimensioned such as to bring about a delay at least equal to the switching time of circuit Mi or associated amplifier Ai. Because of this arrangement, each amplifier will not pass from its precharging phase to its active phase before the differential signal present at its input is evaluated and this property is retained despite manufacturing differences. In particular, this prevents an amplifier from amplifying its input lines before they have a sufficient differential voltage that corresponds to the true logic variable to be amplified. In the contrary case, the amplifier could be displaced from its optimum working point, which would increase its switching time.

Figure 7:
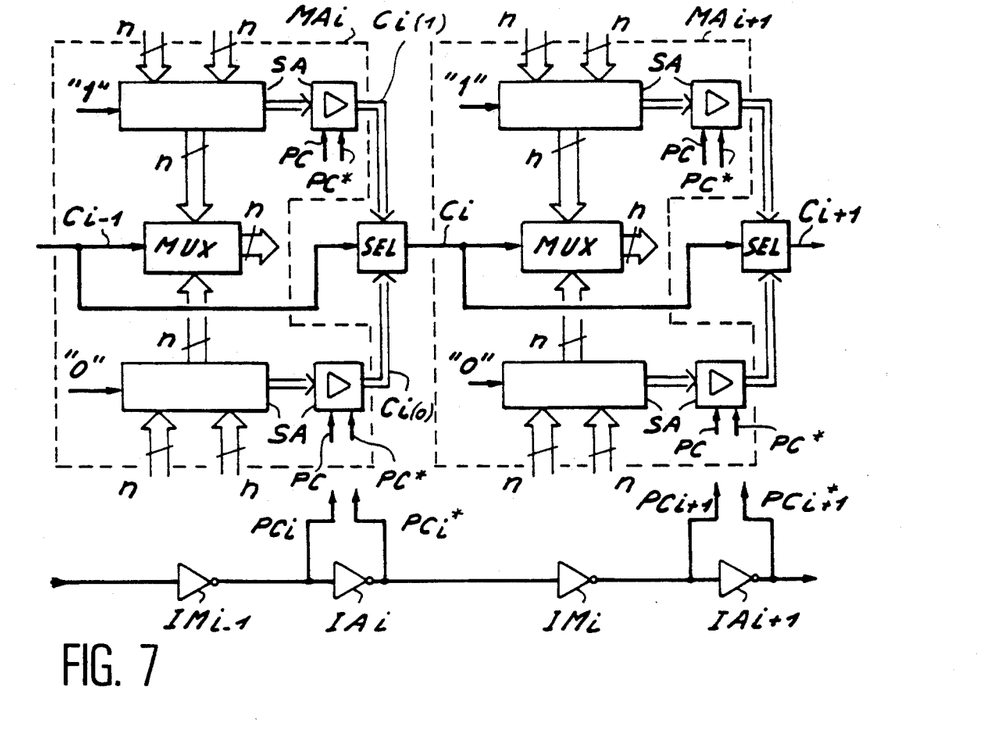
FIG. 7 represents an adder circuit using the method and circuit according to the invention.

FIG. 7 represents part of an adder of the carry select type. This type of adder is known of itself and for more detail reference may be made to the book entitled "Computer Arithmetic - Principle, Architecture and Design," Kai Hwang, published by John Wiley and Sons, 1979, pages 81 to 84. Thus, as shown in FIG. 7, to make an adder of two numbers of n×p bits, p addition modules MAi, MAi+1 are provided, where each addition module except the first has two adders SA with n bits whose carry inputs are pre-positioned at 1 and 0 respectively and a multiplexer MUX to select the n-bit output of one of the two adders. Each addition module MAi is associated with a carry select circuit SEL which supplies a select signal Ci from multiplexer MUX of downstream module MAi+1 as a function of the carry bits Ci(1), Ci(0) coming from the two adders and select signal Ci-1 furnished by the upstream select circuit. The first addition module corresponding to the low weights of the numbers is composed of a single n-bit adder receiving the input carry signal for the operation in question.

By comparison with other types of adders such as those known as "carry lookahead adders," carry select adders have the advantage of a modular and hence regular layout favoring high-density integration. However, the speed of assembly depends on the speed of adders SA and the propagation time of the carries. The speed of the adder SA depends on its design, particularly if it is designed as a ripple carry adder when it will depend on the number n of bits of the numbers it processes. Moreover, the propagation (ripple) time of the carries will depend on the number p of modules MAi. Thus, for example, to make a 64-bit adder, a set of 4 modules with 16 bits may be chosen and in this case the time to execute one addition will be the same as the execution time of one 16-bit addition in an adder SA to which is added the propagation time of three carries. Hence, to benefit from the integration facilities while retaining a speed comparable to the other designs, the propagation time of the carries should be minimized.

A first approach consists of using adders SA furnishing a carry output of the differential type. Advantageously, and according to the invention, this differential carry output is transmitted to the associated select circuit through a differential amplifier according to the above description.

As for the assembly in FIG. 5 and for the same reasons, two clock signals CK1 and CK2 may be used to lock, respectively, the input registers (not shown) containing the operands and the registers located at the outputs of the multiplexers to contain the result. Likewise, precharging is carried out with a series of inverters mounted in a cascade, IMi-1, IAi, IMi, IAi+1. Each inverter IAi is associated with an addition module MAi and furnishes precharging command signals PCi and/or PCi* from the two differential amplifiers of the module. Each select circuit SEL is associated with an inverter IMi dimensioned to bring about a propagation lag in the precharging signals equal to the switching time of the associated select circuit.

The adder circuit in FIG. 7 operates as follows. During the precharging phase, the differential amplifiers are commanded in the precharging mode by the associated precharging command signals PCi, PCi*. During the next evaluation phase, the carry signals are amplified by the differential amplifiers. These amplified signals are received by select circuit SEL which furnishes the command signal Ci to the downstream multiplexer. The same signal Ci is transmitted to the downstream select circuit.

Figure 8:
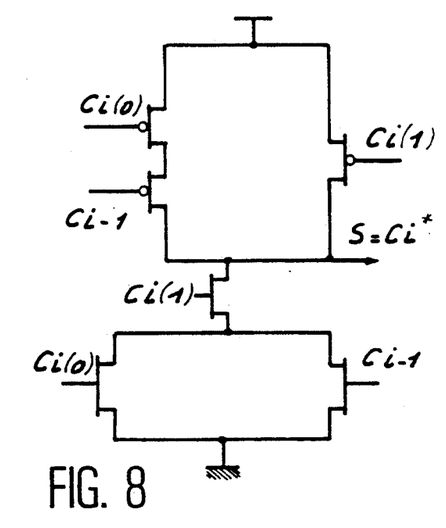
FIGS. 8 and 9 represent embodiments in CMOS technology of a select circuit used in the adder of FIG. 7.
Figure 9:
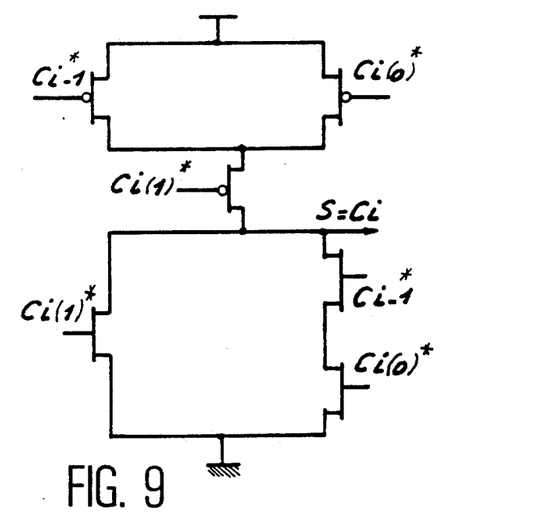

As an illustration of reduction to practice, we will describe the select circuits made with CMOS technology with reference to FIGS. 8 and 9. Signal Ci coming from the select circuit associated with module MAi must check the following logic equation:

$$Ci = Ci(1) \times [Ci\text{-}1 + Ci(0)], \qquad \text{Equation 1}$$

where Ci(1) represents the output carry of the adder SA whose carry input is pre-positioned at 1, Ci(0) represents the output carry of adder SA whose carry input is pre-positioned at zero, and Ci-1 represents the output signal of the select circuit associated with the upstream module.

In practice, it is easier to carry out the complementary function, i.e. Ci*, as shown in FIG. 8. Thus, an inverter should in principle be connected to the output S of this circuit. Now, it is possible to avoid this additional circuit by using alternately the circuit in FIG. 8 without inverter and the circuit shown in FIG. 9 which carries out the logic function:

$$S = Ci(1)^* + [Ci\text{-}1^* \times Ci(0)^*] = Ci, \qquad \text{Equation 2}$$

where Ci(1)*, Ci-1*, and CI(0)* are the complements of the signals defined above.

Of course, in each module receiving the complementary select signal Ci*, pre-positioning of the input carries of the adders SA must be inverted. Finally, it may be noted that only one of the output lines of the amplifiers (the direct output or inverter as the case may be) is used at the input of the select circuits.

According to a second approach to increase the speed of the adder, the process according to the invention can also be applied in each of the elementary adders SA used in addition modules MAi. For this purpose, ripple carry adders SA of the differential type can be used, whose propagation is effected through differential amplifiers according to the arrangement of FIG. 5 where each module Mi is for example a simple four-bit ripple carry adder. In this case, the arrangement of inverters IMi, IAi may be common to several or to all the adders SA in the circuit.

Modifications and substitutions by one of ordinary skill in the art are considered to be within the scope of the present invention which is not to be limited except by the claims which follow.

I claim:

1. A method for transferring an element of binary information represented by a differential voltage present on two first input bit lines to two second, separate output bit lines through a differential amplifier, said method comprising the steps of:
   precharging the input lines of the differential amplifier wherein said precharging step comprises the steps of:
      short-circuiting said first input bit lines to each other; and
      short-circuiting at least one of said second, separate output bit lines to said first bit lines; and evaluating said first bit lines.

2. The method of claim 1 further including the step of short-circuiting said two second, separate output bit lines to each other during said precharging step.

3. A method for transferring an element of binary information represented by a differential voltage present on two first bit lines to two second bit lines through a differential amplifier, said method comprising the steps of:
   precharging said two first bit lines, wherein said precharging step includes the steps of:
      short-circuiting said two first bit lines to each other; and
      short-circuiting at least one of said second bit lines to said first bit lines; evaluating said two first bit lines;
   wherein said differential amplifier comprises a first differential amplifier having a high internal impedance, and a second differential amplifier having three states and having a low internal impedance during said evaluation phase, and wherein inputs and outputs of said first and second differential amplifiers are connected in parallel; and
   wherein said method further includes before the step of short-circuiting said first bit lines the step of placing said second differential amplifier in a sate of high internal impedance during said precharging phase.

4. The method of claim 2 wherein said differential amplifier comprises:
   a first differential amplifier having a high internal impedance; and
   a second differential amplifier having three states and having a low internal impedance during said evaluation step, and wherein inputs and outputs of said first and second differential amplifiers are connected in parallel; and
   wherein said method further includes before the step of short-circuiting said first input bit lines the step of placing said second differential amplifier in a state of high internal impedance during said precharging step.

5. An electronic assembly including an electronic circuit for providing at least one binary output represented by a differential voltage present on two bit lines, said two bit lines coupled to two inputs of a differential amplifier, said two bit lines precharged to a given voltage during a precharging phase which is followed by an evaluation phase, said circuit comprising:
   first means for short-circuiting said two bit lines; and
   second means for selectively short-circuiting at least one of two output lines of the differential amplifier to at least one of said two bit lines, wherein said first and second means are activated during said precharging phase and wherein when said second means is not activated each of said two bit lines are electrically isolated from each of said two output lines of the differential amplifier.

6. The assembly of claim 5 further including third means for short-circuiting the two output lines of the differential amplifier to each other.

7. The assembly of claim 5 wherein said differential amplifier includes a first differential amplifier having a high internal impedance and a second differential amplifier having three selectable states and having a state of low internal impedance during said precharging phase, the inputs and the outputs of said first and second differential amplifiers connected in parallel; and
   wherein said second differential amplifier is placed in a state of high internal impedance during said precharging phase.

8. The assembly of claim 6 wherein said differential amplifier includes a first differential amplifier having a high internal impedance and a second differential amplifier having three states and having a low internal impedance during said precharging phase, the inputs and the outputs of said first and second differential amplifiers connected in parallel; and
   wherein said second differential amplifier is placed in a state of high internal impedance during said precharging phase.

9. The assembly of claim 7 wherein said first and second differential amplifiers are made by CMOS technology.

10. The assembly of claim 9 wherein the the internal impedance of said first and second amplifiers are defined by the width of the MOS transistors of which said amplifiers are made.

11. The electronic assembly of claim 5 further including a plurality of said electronic circuits connected in cascade, each of said electronic circuits furnishing an output to at least one downstream cascade connected circuit, said output including at least one element of binary information represented by a differential voltage.

12. The electronic assembly of claim 11 further including:
   a plurality of inverters connected in cascade, one of said plurality of inverters associated with each of said plurality of electronic circuits and with each of said plurality of differential amplifiers comprising said assembly; and
   wherein a first one of said inverters receives an input clock signal, and wherein said precharging and said evaluation phases of each of said differential amplifiers are controlled by one of an input signal and an output signal of said inverter associated with each of said respective differential amplifiers.

13. The electronic assembly of claim 5 wherein said electronic circuit includes an adder circuit of the carry select type for two numbers having n×p bits, said adder circuit including p serially connected addition modules, each module comprising:

two n bit adders, said first of two n-bit adders having a carry input which is pre-selected at 1 and said second of two n bit adders having a carry input pre-selected at 0;

a multiplexer for selecting the output of one of said two adders;

wherein each of said two n bit adders includes a binary carry output represented by a differential voltage present on two bit lines; and each of said p addition modules except a first addition module including an associated carry select circuit, for furnishing a carry select signal to a multiplexer of an adjacent downstream serially connected addition module as a function of said binary carry output bits from said two n-bit adders of a given module, and from a select signal provided by an upstream select circuit of an upstream addition module.

14. The electronic assembly of claim 13 wherein said binary carry output of each of said two n-bit adders of each of said addition modules is provided by a differential amplifier operable in a precharging phase followed by an evaluation phase, said adder circuit including a plurality of inverters connected in cascade, one of said plurality of inverters associated with each of said carry select circuits and with said differential amplifiers of a given addition module, and wherein a first one of said inverters receives an input clock signal, and wherein said precharging and said evaluation phases of each of said differential amplifiers are controlled by one of an input and an output signal of said inverter associated with each of said respective differential amplifiers.

15. A method for transferring an element of binary information represented by a differential voltage present on two first input bit lines to two second, separate output bit lines through a differential amplifier, said method comprising the steps of:

precharging the input lines of the differential amplifier wherein said precharging step comprises the steps of:

short-circuiting said first input bit lines to each other; and short-circuiting at least one of said second, separate output bit lines to said first bit lines; and evaluating said first bit lines;

short-circuiting said two second, separate output bit lines to each other during said precharging step; wherein said differential amplifier comprises:

a first differential amplifier having a high internal impedance; and a second differential amplifier having three states and having a low internal impedance during said evaluation phase, and wherein inputs and outputs of said first and second differential amplifiers are connected in parallel; and wherein said method further includes before the step of short-circuiting said first bit lines the step of placing said second differential amplifier in a state of high internal impedance during said precharging step.

* * * * *